United States Patent
Kim

(10) Patent No.: US 7,365,390 B2
(45) Date of Patent: Apr. 29, 2008

(54) METHOD OF FABRICATING RECESS TRANSISTOR IN INTEGRATED CIRCUIT DEVICE AND RECESS TRANSISTOR IN INTEGRATED CIRCUIT DEVICE FABRICATED BY THE SAME

(75) Inventor: Ji-Young Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/691,044

(22) Filed: Mar. 26, 2007

(65) Prior Publication Data

US 2007/0190716 A1    Aug. 16, 2007

Related U.S. Application Data

(62) Division of application No. 10/849,671, filed on May 19, 2004, now Pat. No. 7,220,640.

(30) Foreign Application Priority Data

May 19, 2003    (KR) ................................ 2003-31547

(51) Int. Cl.
*H01L 29/76* (2006.01)
*H01L 29/94* (2006.01)
*H01L 31/00* (2006.01)

(52) U.S. Cl. ...................................... 257/327; 257/344

(58) Field of Classification Search ................ 257/327, 257/344, 336, 403, 404, 408, 386, 345, 270
See application file for complete search history.

(56) References Cited

U.S. PATENT DOCUMENTS

| | | | |
|---|---|---|---|
| 6,255,158 B1 | 7/2001 | Furukawa et al. | |
| 6,333,230 B1 | 12/2001 | Bryant et al. | |
| 6,555,872 B1 * | 4/2003 | Dennen | 257/327 |
| 6,740,592 B1 | 5/2004 | Doong | |
| 6,825,092 B2 | 11/2004 | Zurcher et al. | |
| 6,884,677 B2 | 4/2005 | Kim | |
| 2004/0067618 A1 * | 4/2004 | Chang et al. | 438/264 |

* cited by examiner

*Primary Examiner*—Walter L Lindsay, Jr.
(74) *Attorney, Agent, or Firm*—Marger Johnson & McCollom, P.C.

(57) ABSTRACT

Provided is a method of fabricating a recess transistor in an integrated circuit device. In the provided method, a device isolation region, which contacts to the sidewall of a gate trench and a substrate region remaining between the sidewall of the device isolation region and the sidewall of the gate trench, is etched to expose the remaining substrate region. Thereafter, the exposed portion of the remaining substrate region is removed to form a substantially flat bottom of the gate trench. The recess transistor manufactured by the provided method has the same channel length regardless of the locations of the recess transistor in an active region.

8 Claims, 10 Drawing Sheets

METHOD OF FABRICATING RECESS TRANSISTOR IN INTEGRATED CIRCUIT DEVICE AND RECESS TRANSISTOR IN INTEGRATED CIRCUIT DEVICE FABRICATED BY THE SAME

CROSS REFERENCE TO RELATED APPLICATIONS

This application is a divisional of U.S. patent application Ser. No. 10/849,671, filed May 19, 2004, now U.S. Pat. No. 7,220,640, issue on which is claims priority from Korean Patent Application No. 2003-31547, filed on May 19, 2003, in the Korean Intellectual Property Office, the disclosure of which is incorporated herein in its entirety by reference.

BACKGROUND OF THE INVENTION

1. Field of the Invention

This disclosure relates to a method of fabricating an integrated circuit device, and more particularly, to a method of fabricating a recess transistor in an integrated circuit device and a recess transistor in an integrated circuit device fabricated by the same.

2. Description of the Related Art

As integrated circuit devices become highly integrated and the length of channels of MOS transistors shortens, punch-through errors may occur between a source and a drain in a flat-type transistor. Thus, a shortened channel in the MOS transistors causes the integrated circuits to malfunction. As a result, recess transistors have been developed to increase a channel length.

FIG. 1 is a plan diagram illustrating an active region pattern (A/P) and a gate pattern (G) for a unit cell in a conventional recess transistor. FIGS. 2A through 2C are cross-sectional diagrams illustrating the conventional recess transistor of FIG. 1. FIGS. 2A, 2B, and 2C are taken along the lines A-A', B-B', and C-C' of FIG. 1, respectively.

Referring to FIG. 2A, a gate trench (90) is formed in an active region, which is defined by a shallow trench isolation (STI) (40a). Here, a recess transistor includes a recess gate (98) buried in the gate trench (90) and source/drain regions (50) formed at the both sides of the recess gate (98). In the conventional recess transistor, a channel is formed along the circumference of the trench (90), as shown in FIG. 2A. Accordingly, the channel length (Chc) of the recess transistor is larger than the channel length (Chp) of a conventional flat-type transistor, which is formed on a silicon substrate (10) in parallel. Accordingly, the generation of punch-through errors between the source region and the drain region is minimized.

However, when the recess transistor is formed by a conventional method, the STI (40a) and the gate trench (90) are not formed with completely vertical sidewalls but are inclined due to the limits of dry etching for forming the STI (40a) and the gate trench (90), as shown in FIG. 2C. Accordingly, portions of the silicon substrate (10) remain between the sidewalls of the STI (40a) and the sidewalls of the gate trench (90) as shown in the dotted circles of FIG. 2C. When the portions of the silicon substrate (10) remain at the lower parts of the source/drain regions (50), the channel length (Chc) of the recess transistor at the central portion of the active region, which will be referred to as TRc hereafter, and the channel length (Che) of the recess transistor at the edges of the active region, which will be referred to as TRe hereafter, become different, as shown in FIGS. 2A and 2B, respectively. In other words, the channel length (Che) of TRe shown in FIG. 2B becomes shorter than the channel length (Chc) of TRe shown in FIG. 2A. When the channel length is reduced, the threshold voltage of the transistor is reduced so that subthreshold leakage current in TRe increases. Moreover, when the silicon substrate (10) remains in the source/drain regions (50), shorts may occur between the source region and the drain region. Accordingly, an improved recess transistor is required.

Embodiments of the invention address these and other disadvantages of the conventional art.

SUMMARY OF THE INVENTION

Some embodiments of the invention provide a method of fabricating a recess transistor in an integrated circuit device that completely removes a substrate region remaining at the sidewalls of a gate trench. Other embodiments of the invention provide a recess transistor in an integrated circuit device that has a recess gate including a bottom, which is substantially flat.

BRIEF DESCRIPTION OF THE DRAWINGS

The above aspects and advantages of the invention will become more apparent by describing in detail preferred embodiments thereof with reference to the attached drawings.

DETAILED DESCRIPTION OF THE INVENTION

Figure 1:
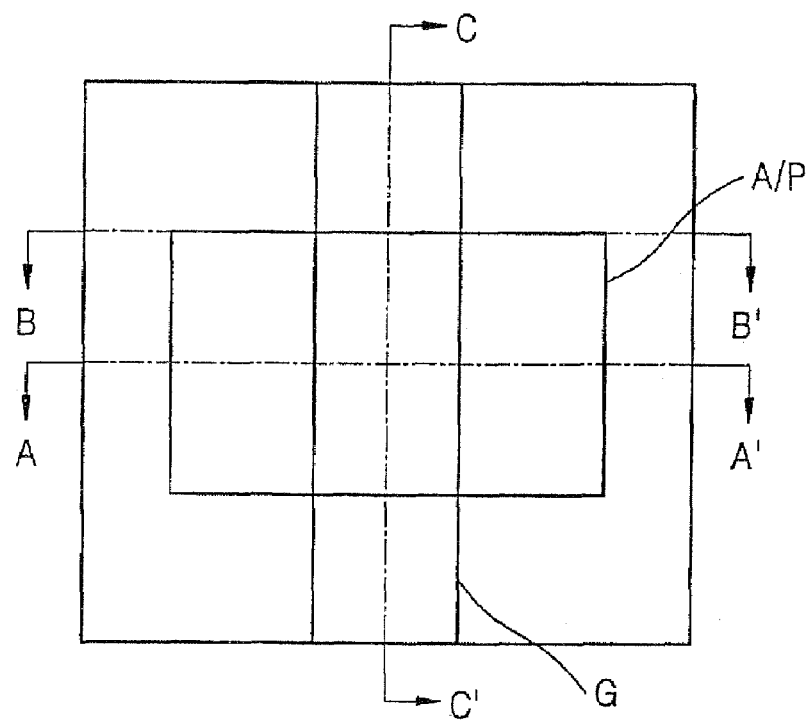
FIG. 1 is a plan diagram illustrating an active region pattern and a gate pattern for a unit cell in a conventional recess transistor.
Figure 2A:
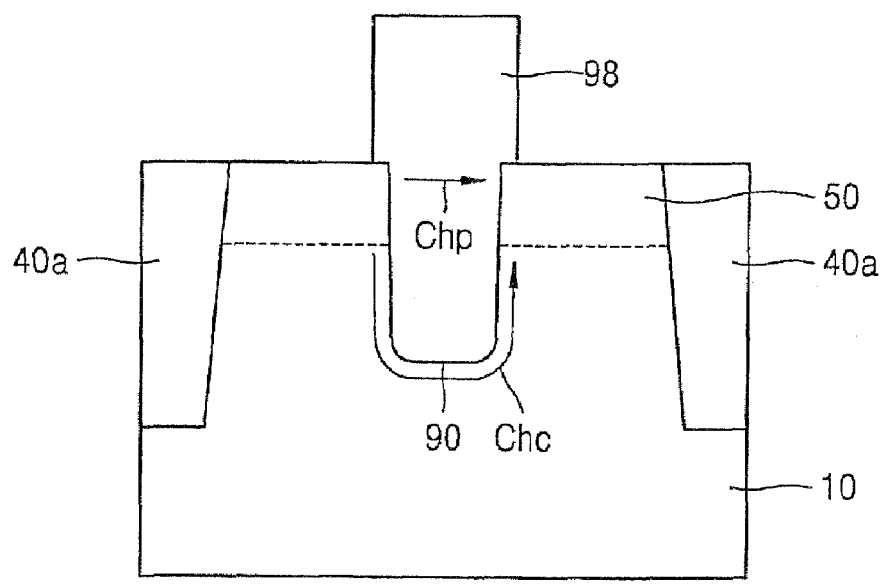
FIGS. 2A, 2B, and 2C are cross-sectional diagrams illustrating the conventional recess transistor of FIG. 1, taken along the lines A-A', B-B', and C-C' of FIG. 1, respectively.
Figure 2B:
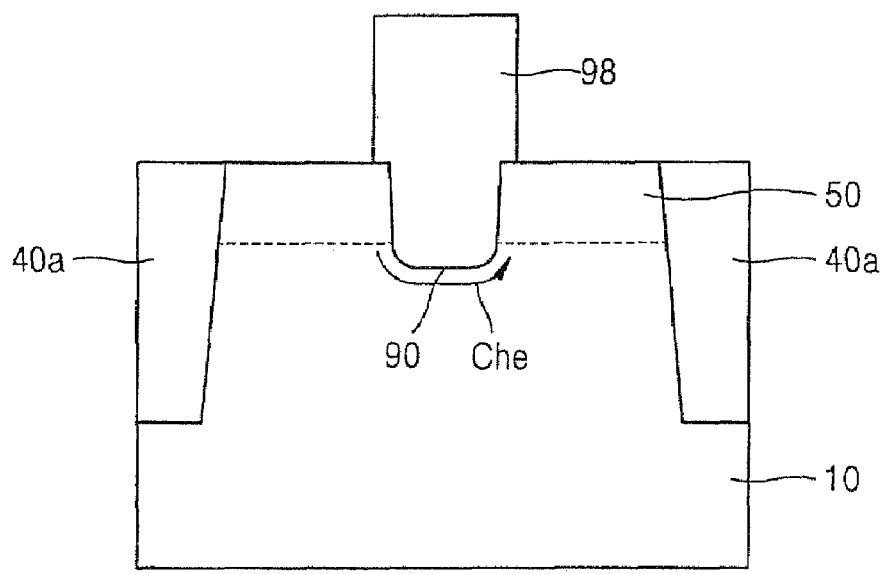
Figure 2C:
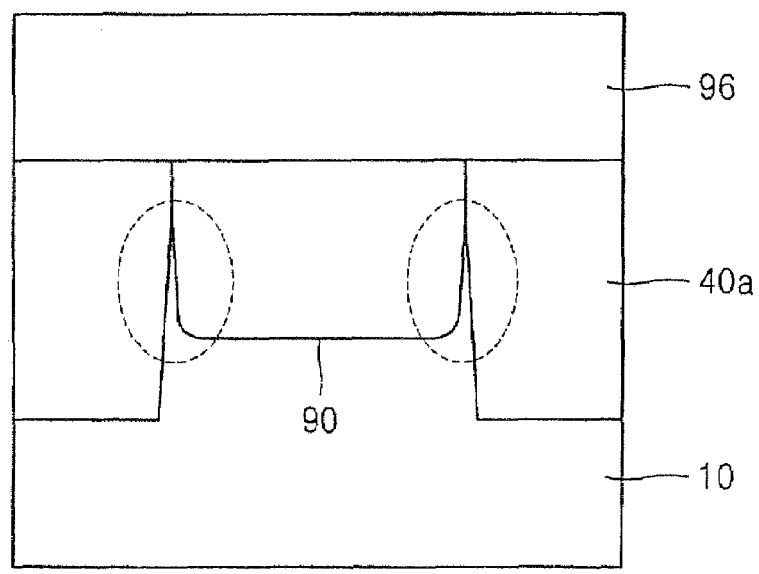

The invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus duplicative descriptions of similar elements appearing throughout the figures will be omitted. In the drawings, the thicknesses of layers and regions are exaggerated for clarity.

FIGS. 3-16 are cross-sectional diagrams illustrating a method of fabricating a recess transistor in an integrated circuit device according to some embodiments of the invention. In FIGS. 3-16, portion a-a' illustrates one cross-sectional view of the embodiments and portion b-b' illustrates another cross-sectional view of the embodiments. The cross-sections a-a' and b-b' correspond to the cross-sections A-A' and C-C', respectively, in the diagram of FIG. 1.

Figure 3:
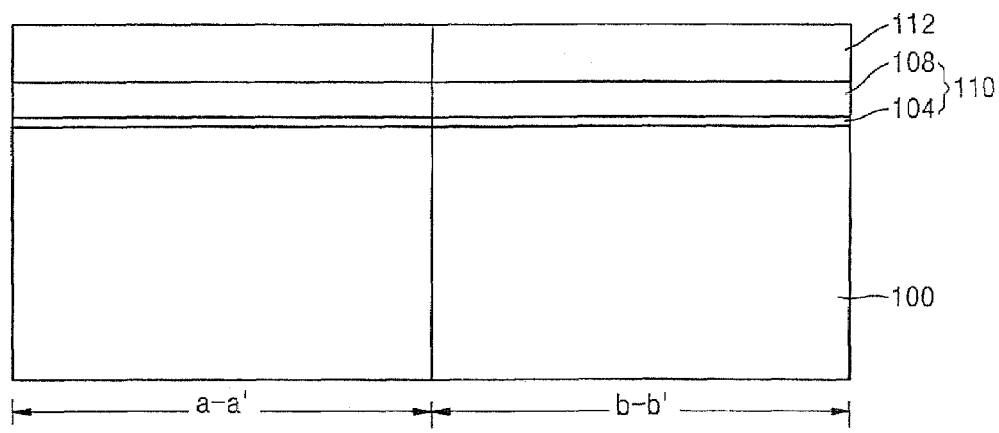
FIGS. 3-16 are cross-sectional diagrams illustrating a method of fabricating a recess transistor according to some embodiments of the invention.

Referring to FIG. 3, a pad insulating layer (110) is formed by sequentially forming an oxide layer (104) and a nitride layer (108) on an integrated circuit substrate (100), for example, a silicon substrate. Then, an organic anti-reflection coating (ARC) (not shown) and a photoresist (112) are sprayed on the pad insulating layer (110). Here, the oxide layer (104) is formed to a thickness of about 100 Å in order to reduce stress between the substrate (100) and the nitride layer (108). The nitride layer (108), which is used as an etch mask when etching to form a shallow trench isolation (STI) region, is formed by depositing silicon nitride to a thickness of about 800 to 850 Å. The silicon nitride is deposited by a conventional method, for example, chemical vapor deposition (CVD), sub-atmospheric CVD (SACVD), low pressure CVD (LPCVD), or plasma enhanced CVD (PECVD).

Figure 4:
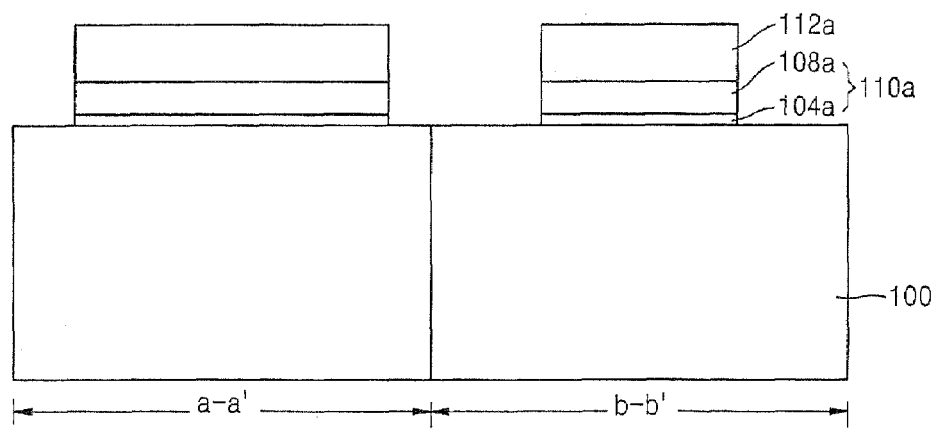

Referring to FIG. 4, a photoresist pattern (112a), which defines an active region, is formed. Thereafter, the pad insulating layer (110) is patterned by dry etching using the photoresist pattern (112a) as an etch mask to form a pad mask (110a) including a nitride layer pattern (108a) and a thermal oxide layer pattern (104a). The nitride layer (108) is etched by using fluorocarbon based gas, for example, CxFy based gas or CaHbFc based gas, such as $CF_4$, $CHF_3$, $C_2F_6$, $C_4F_8$, $CH_2F_2$, $CH_3F$, $CH_4$, $C_2H_2$, $C_4F_6$, or a mixture thereof. Here, argon (Ar) gas is used as an atmosphere gas.

Figure 5:
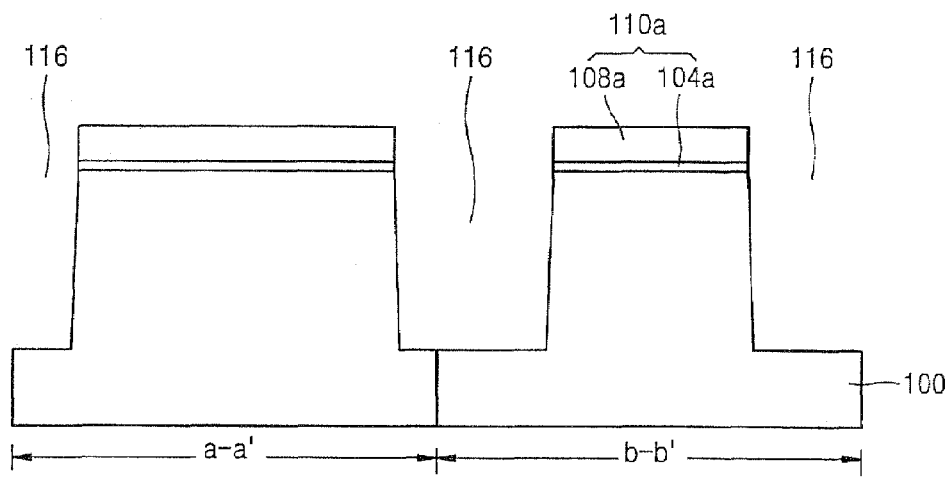

Referring to FIG. 5, after the photoresist pattern (112a) is removed, anisotropic etching is performed on the exposed portion of the substrate (100) by using the pad mask (110a) as an etch mask so that a trench (116), which defines an active region, is formed. Here, the photoresist pattern (112a) can be removed by a conventional method, for example, ashing by using oxygen plasma and organic stripping. It is preferable that the trench (116) is formed at an aspect ratio sufficient to avoid forming voids when burying an insulating layer in the trench (116). For example, when a high density plasma (HDP) oxide layer is buried in the trench (116), it is preferable that the trench (116) is formed with an aspect ratio of less than about 3.0.

Figure 6:
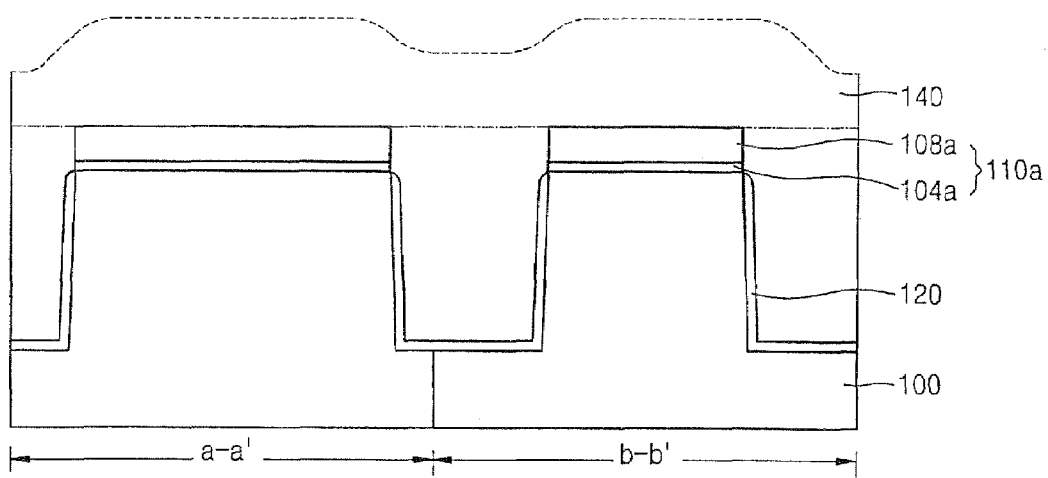

Referring to FIG. 6, a silicon oxide layer (120) is formed on the resultant structure including the trench (116) in order to protect the inner walls of the trench (116). Thereafter, an insulating layer, which is selected from a group formed of an USG layer, an HDP oxide layer, a TEOS layer formed by PECVD, an oxide layer formed by PECVD, and a composition thereof, is used to fill the trench (116). Here, it is preferable that a HDP oxide layer (140) is used to fill the trench (116). In the HDP CVD process, in which CVD and etching in a sputtering manner are combined, not only a deposition gas for depositing a material layer but also a sputtering gas for etching the deposited material layer in the sputtering manner is supplied to a chamber. Accordingly, $SiH_4$ gas and $O_2$ gas are supplied to the chamber, and an inactive gas, for example, Ar gas, is supplied to the chamber as the sputtering gas. Portions of the deposition gas and the sputtering gas are ionized by plasma, which is induced in the chamber by a high frequency power. On the other hand, since a biased high frequency power is applied to a wafer chuck, for example, an electrostatic chuck, on which the substrate (100) is loaded, the ionized deposition gas and sputtering gas are accelerated toward the surface of the substrate (100). The accelerated deposition gas ions form a silicon oxide layer, and the accelerated sputtering gas ions sputter the deposited silicon oxide layer so that the HDP oxide layer (140) having an upper surface shaped as shown in FIG. 6 is formed.

Figure 7:
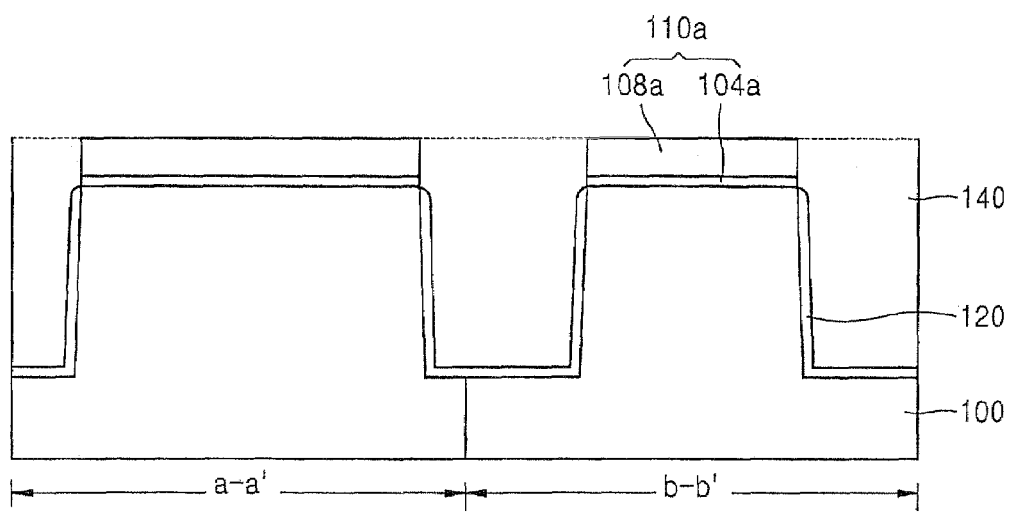

Referring to FIG. 7, the HDP oxide layer (140) is planarized to the same level as the upper surface of the pad mask (110a). For example, the HDP oxide layer (140) can be planarized by chemical mechanical polishing (CMP) or etch back. Here, the nitride layer pattern (108a) is used as a planarization stop layer. For example, when the HDP oxide layer (140) is planarized by CMP, the nitride layer pattern (108a) is used as a CMP stopper. It is preferable that a slurry, which etches the HDP oxide layer (140) better than the nitride layer pattern (108a), is used in the CMP. Accordingly, a slurry that includes a ceria-based abrasive can be used.

Figure 8:
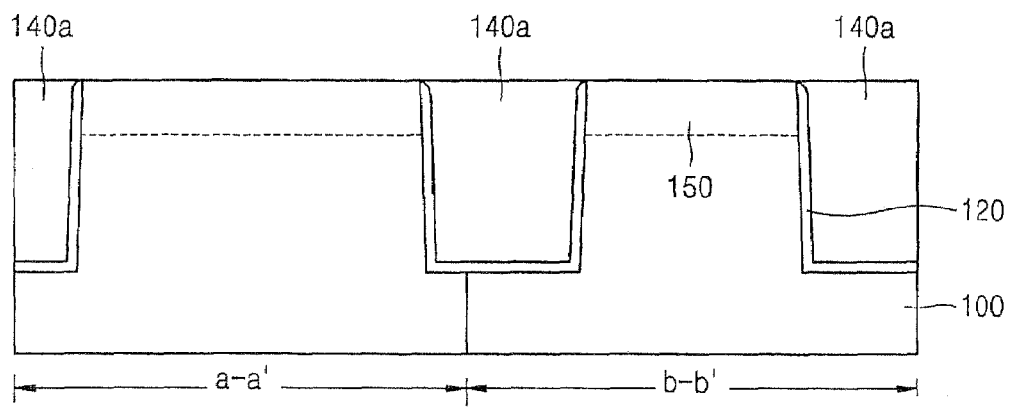

Referring to FIG. 8, the pad mask (110a) is removed to form an STI (140a). The nitride layer pattern (108a) of the pad mask (110a) is removed by applying phosphoric stripping, and the thermal oxide layer pattern (104a) of the pad mask (110a) is removed by using HF or buffered oxide etchant (BOE). Thereafter, source/drain regions (150) are formed by implanting impurities having a conductive type different from that of the substrate (100), for example, n-type impurities, to the surface of the substrate (100) including the STI 140a.

Figure 9:
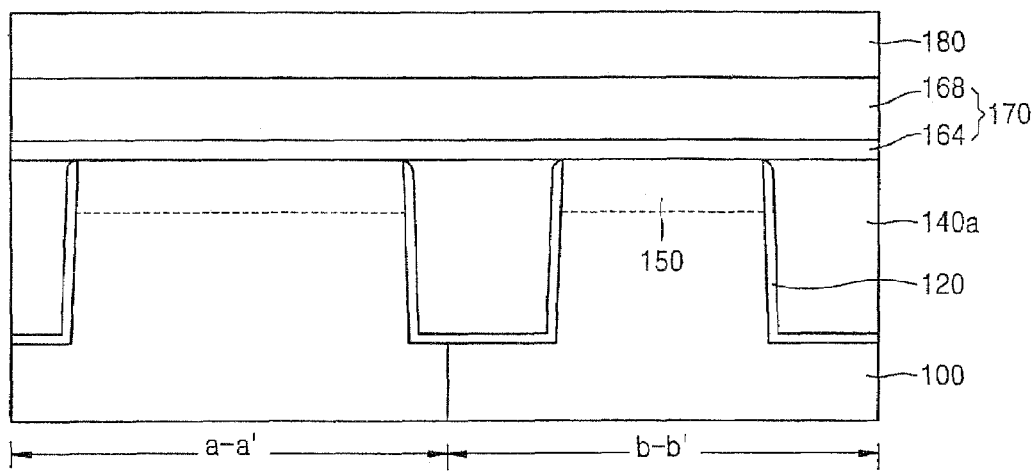

Referring to FIG. 9, a thermal oxide layer (164) and a polysilicon layer (168) are sequentially formed on the surface of the substrate (100) including the source/drain regions (150) in order to form a hard mask layer (170). Thereafter, an ARC (not shown) and a photoresist (180) are deposited on the hard mask layer (170). In considering the function of the thermal oxide layer (164) as an etch stop layer, it is preferable that the thermal oxide layer (164) is a middle temperature oxide (MTO) layer formed by using $SiH_4$, $Si_2H_6$, and $N_2O$ gases as reactant gases. Here, the MTO layer is formed to a thickness of about 200 Å. The polysilicon layer (168) is formed to a thickness of about 1,000 Å by using $N_2$ and $SiH_4$ gases as reactant gases. The thermal oxide layer (164) and the polysilicon layer (168) are formed by CVD, SACVD, LPCVD, or PECVD, and most preferably by LPCVD.

Figure 10:
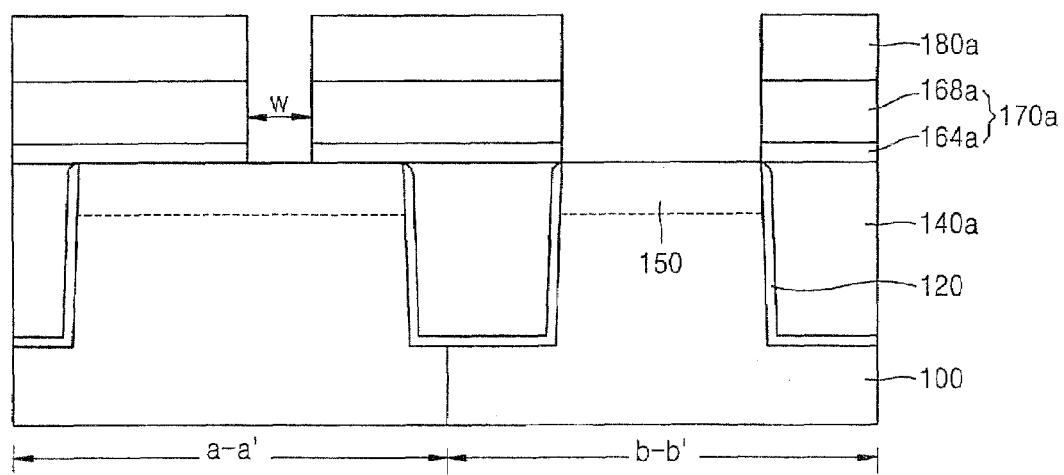

Referring to FIG. 10, a photoresist pattern (180a), which defines a gate trench, is formed. Thereafter, the hard mask layer (170) is patterned by anisotropic etching by using the photoresist pattern (180a) as an etch mask so that a hard mask (170a) formed of a polysilicon layer pattern (168a) and a thermal oxide layer pattern (164a) is formed. Here, the polysilicon layer (168) is etched by using HBr, $Cl_2$, $CClF_3$, $CCl_4$, or $SF_6$ as a main etch gas. The thermal oxide layer (164) is etched by using a fluorocarbon based gas, which is described above. The width (w) of the gate trench, which is defined by the hard mask (170a), is about 50 to 100 nm.

Figure 11:
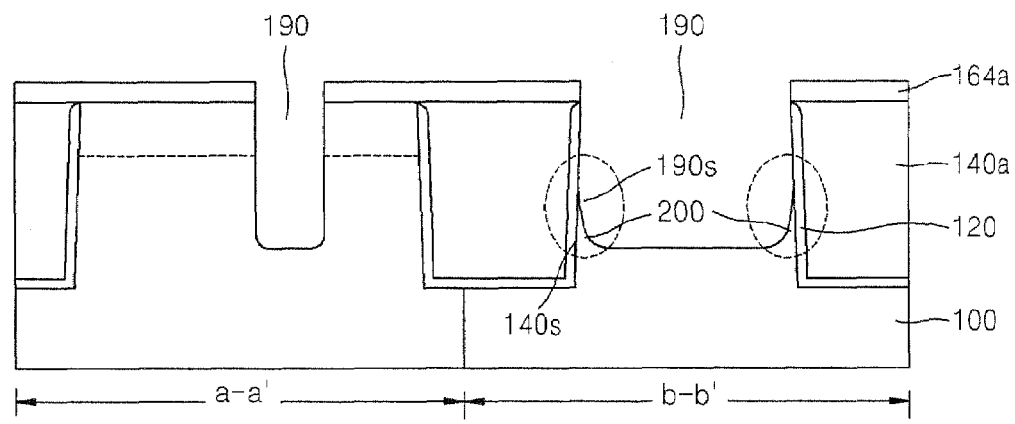

Referring to FIG. 11, after removing the photoresist pattern (180a), anisotropic etching is performed on the exposed portions of the substrate (100) by using the hard mask (170a) as an etch mask to form a gate trench (190). The depth of the gate trench (190) is greater than that of the source/drain regions (150). It is preferable that the depth of the gate trench (190) be about 1,500 Å. While etching the substrate (100) to form the gate trench (190), the polysilicon layer pattern (168a) of the hard mask (170a) is removed. Here, the upper surface of the thermal oxide layer pattern (164a) is used as an etch stopper. Accordingly, the gate trench (190) is formed by reactive ion etching (RIE) using polysilicon etch gas and silicon etch gas, which has a larger etch selectivity to the thermal oxide layer pattern (164a), such as HBr, $Cl_2$, $CClF_3$, $CCl_4$, or SF. It is preferable that the gate trench (190) be formed by using the mixture of HBr and $Cl_2$. Here, since the STI (140a) and the gate trench (190) have predetermined inclinations, substrate regions (200) remain between the sidewalls (190s) of the gate trench (190) and the sidewalls (140s) of the STI (140a).

Figure 12:
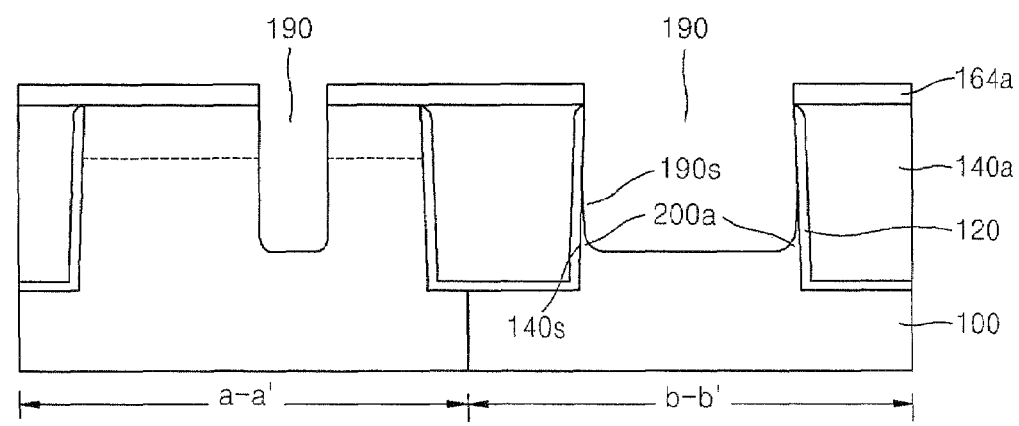

Referring to FIG. 12, portions of the substrate regions (200), which remain between the sidewalls (190s) of the gate trench (190) and the sidewalls (140s) of the STI (140a), are etched. Here, isotropic etching, for example, chemical dry etching (CDE), is performed to etch the portions of the substrate regions (200). As a result, partially etched substrate regions (200a) remain. Here, CDE is performed by using the mixture of $CF_4$ and $O_2$. It is preferable that CDE is performed at a power of 400 W and a pressure of 30 Pa while controlling the ratio of $O_2/CF_4$ at about 2.5.

Figure 13:
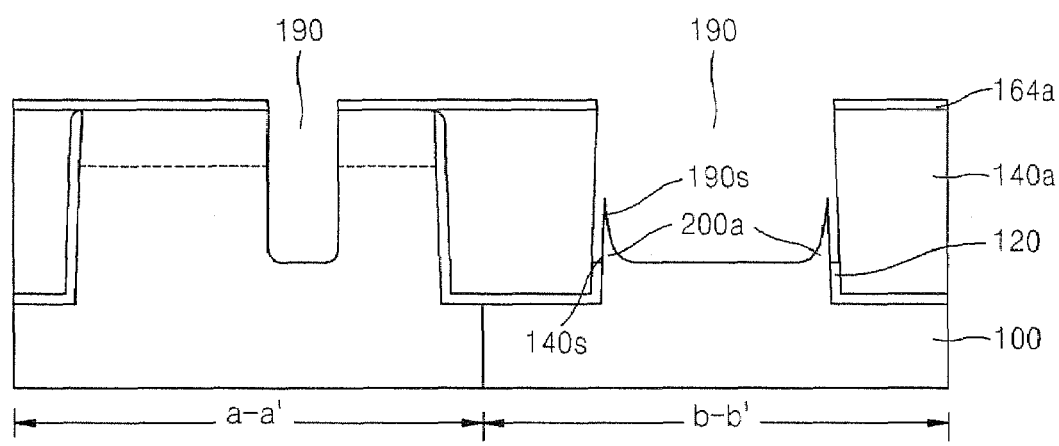

Referring to FIG. 13, isotropic wet etching is preformed on the resultant structure. As a result, the sidewalls (140s) of the STI (140a), which are adjacent to the sidewalls (190s) of the gate trench (190) and exposed to the gate trench (190), are etched so that the portions of the substrate regions (200a) remaining between the sidewalls (140s, 190s) are exposed in a canine tooth shape. The isotropic etching is performed for a period of time of etching the sidewalls (140s) of the STI (140a) to about 150 Å, by using HF or BOE. Here, a portion of the thermal oxide layer pattern (164a) of the hard mask (170a) is etched.

Figure 14:
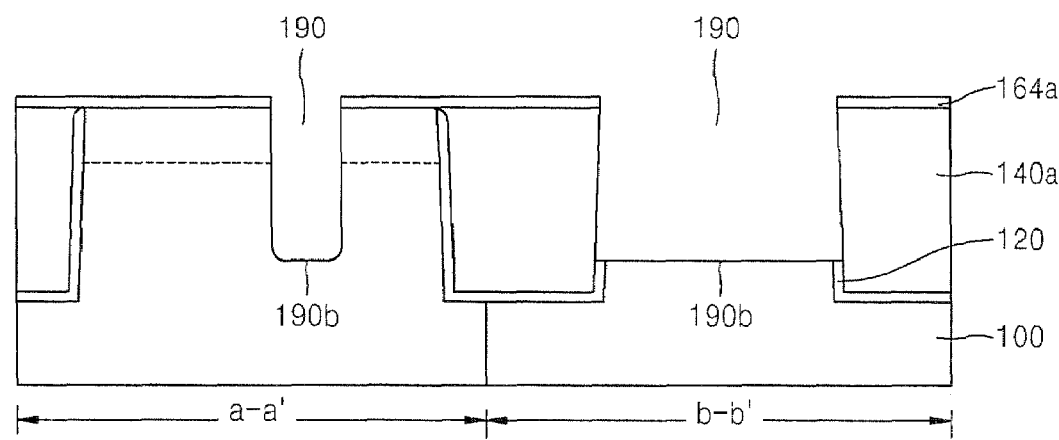

Referring to FIG. 14, CDE as isotropic dry etching is performed to remove the canine tooth shaped substrate regions (200a). Since the remaining substrate regions (200a) are separated from the sidewalls (140s) of the STI (140a), etch gas can be easily introduced into the gap between the sidewalls (140s) of the STI (140a) and the remaining substrate regions (200a). Accordingly, the remaining substrate regions (200a) are easily removed so that a bottom (190b) of the gate trench (190) is substantially flat. In order to completely remove the canine tooth shaped substrate regions (200a), it is preferable that CDE is performed during the period of time of etching the silicon substrate to about 100 Å.

Figure 15:
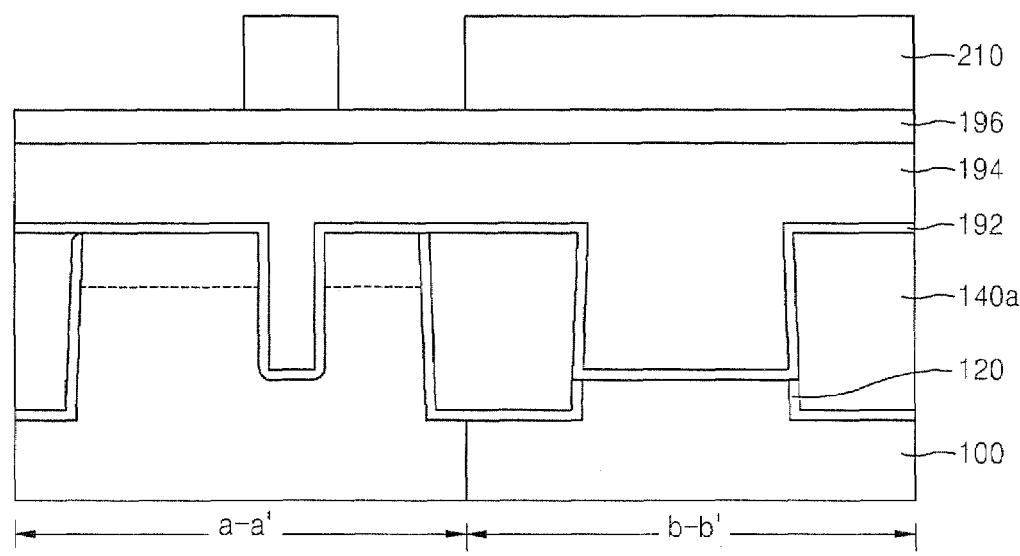

Referring to FIG. 15, after the remaining thermal oxide layer pattern (164a) is removed by using HF or BOE, a gate oxide layer (192) is formed to a thickness of less than 40 Å. Here, the gate oxide layer (192) may be formed by dry oxidation using $O_2$ gas at a temperature of 1,000 to 1,100° C., wet oxidation using vapor atmosphere at a temperature of 1,000 to 1,100° C., HCl oxidation using the mixture of $O_2$ gas and HCl gas, oxidation using the mixture of $O_2$ gas and $C_2H_3Cl_3$ gas, or oxidation using the mixture of $O_2$ gas and $C_2H_2Cl_2$ gas. Thereafter, a conductive layer (194) for the gate electrode is formed to fill the gate trench (190). Here, the conductive layer (194) for the gate electrode may be formed by using a doped polysilicon layer, by using a metallic layer, by sequentially depositing a doped polysilicon layer and a metallic layer, or by sequentially depositing a doped polysilicon layer and a metallic silicide layer. Here, it is preferable that the metallic layer is a tungsten layer, a cobalt layer, or a nickel layer, and that the metallic silicide layer is a tungsten silicide layer or a cobalt silicide layer. The doped polysilicon layer is formed by LPCVD using $SiH_2Cl_2$ gas and $PH_3$ gas. The tungsten silicide layer is formed by LPCVD using $SiH_2Cl_2$ gas and $WF_6$ gas. A nitride layer (196), ARC (not shown), and a photoresist pattern (210), which defines the gate electrode, are sequentially formed on the conductive layer (194) for the gate electrode.

Figure 16:
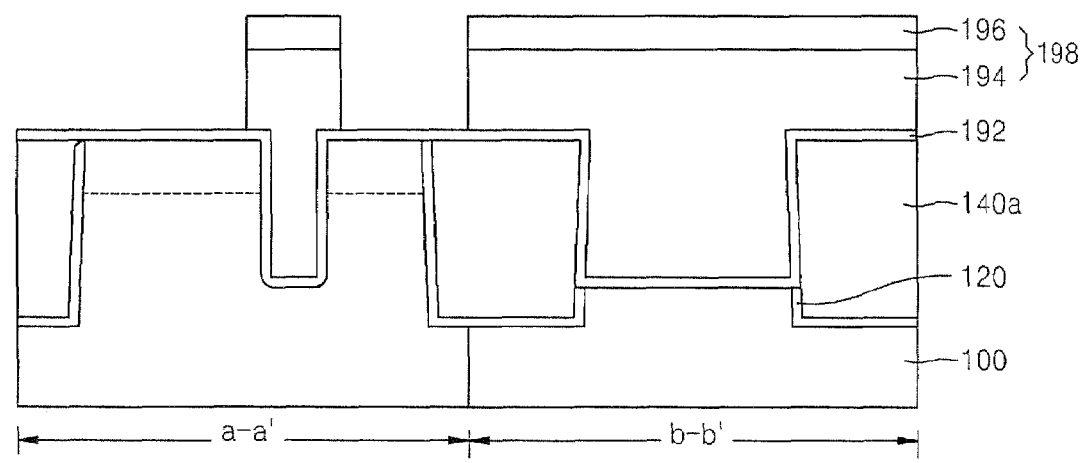

Referring to FIG. 16, the ARC (not shown), the nitride layer (196), and the conductive layer (194) for gate electrode are dry etched by using the photoresist pattern (210) as an etch mast to form a gate electrode (198). Thereafter, the photoresist pattern (210) is removed.

Thereafter, conventional integrated circuit device processes are performed to complete the integrated circuit device.

In the embodiments described above, the substrate regions (200) are removed by performing isotropic dry etching as a first CDE, wet etching, and isotropic dry etching as a second CDE. However, the substrate regions (200) may also be removed by performing wet etching and isotropic dry etching only.

Figure 17:
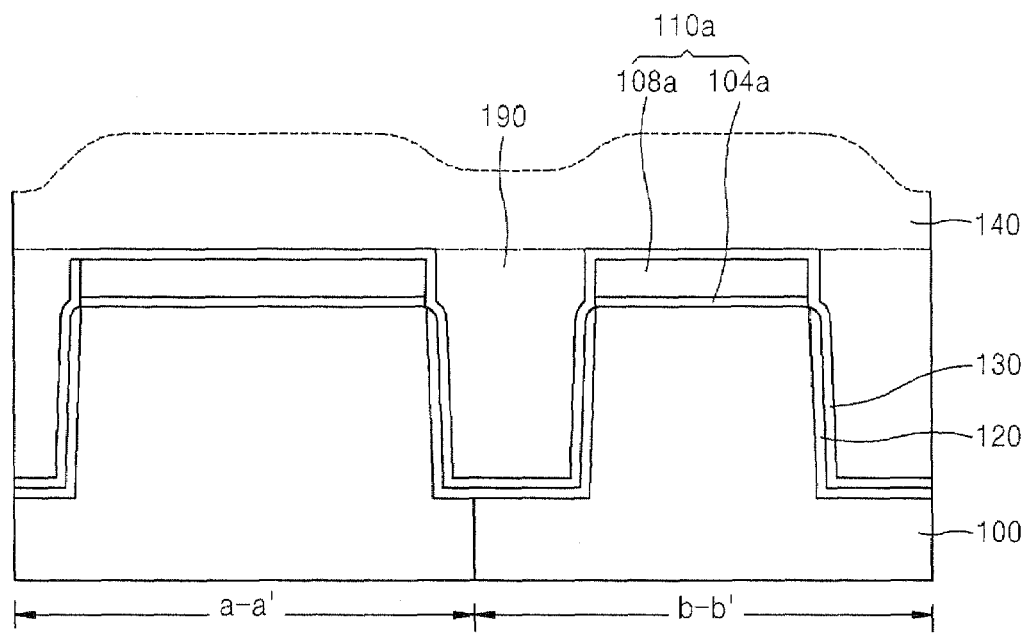
FIGS. 17 and 18 are cross-sectional diagrams illustrating a method of fabricating a recess transistor according to some other embodiments of the invention.
Figure 18:
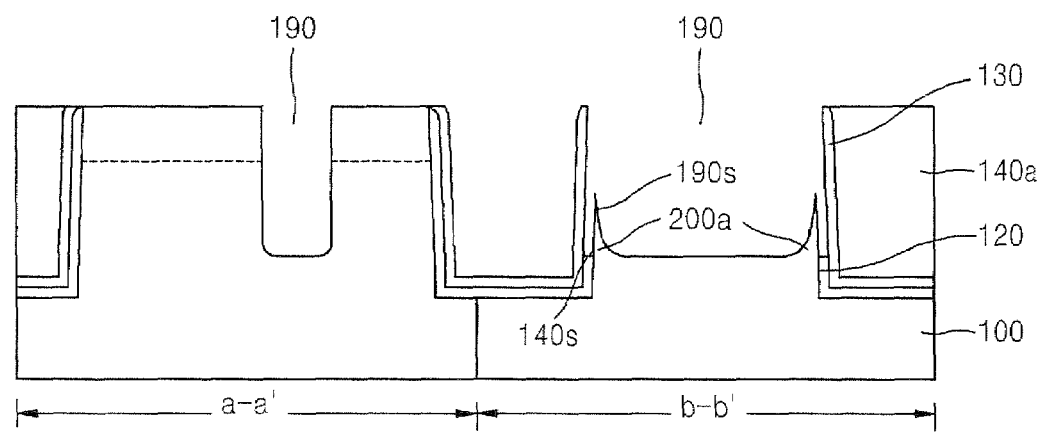

FIGS. 17 and 18 are cross-sectional diagrams illustrating a method of fabricating a recess transistor in an integrated circuit device according to some other embodiments of the invention. Reference numerals in FIGS. 17 and 18 that also appear in FIGS. 3-16 denote like elements, and thus duplicative descriptions will be omitted.

Processes are performed until an oxide layer (120) is formed on the sidewalls of a trench (190) that are described with reference to FIGS. 3 through 6.

Referring to FIG. 17, a nitride layer (130) is formed on the resultant structure including the oxide layer (120). The nitride layer (130) is included in an STI while operating as a nitride layer liner in order not to oxidize the oxide layer (120) more than a predetermined amount and to enhance the insulating characteristic of the STI. Here, the nitride layer (130) is formed to a thickness of about 50 to 300 Å.

Processes of forming an insulating layer (140), which completely fills the trench (190), on the resultant structure including the nitride layer (130) and performing first CDE are performed as described with reference to FIGS. 7 through 12.

Referring to FIG. 18, isotropic wet etching is performed on the resultant structure on which the first CDE is performed. As a result, sidewalls (140s) of STI (140a), which are adjacent to sidewalls (190s) of the gate trench (190) and exposed to the gate trench (190), are etched so that substrate regions (200a) remaining between the sidewalls (140s, 190s) are exposed in a canine tooth shape. Here, since the nitride layer liner (130) operates as an etch stop layer of isotropic wet etching, the isotropic wet etching process can be easily controlled. Thereafter, the processes described with reference to FIGS. 14 through 16 are performed to complete the process of forming a recess gate electrode.

When a recess transistor in an integrated circuit device is formed according to the embodiments of the invention described above, the bottom (190b) of the gate trench (190) is flat as shown in FIG. 16. Accordingly, the bottom (190b) of a recess gate, which is formed in the gate trench (190), also becomes substantially flat. As a result, the channel lengths of TRc and TRe are the same.

As described above, when a recess transistor in an integrated circuit device is fabricated according to the embodiments of the invention describe above, the channel length of the recess transistor is uniform regardless of the locations in an active region. Thus, the problems of reduction of a threshold voltage and increase of a subthreshold leakage current that occur at the edge of the active region where the channel length is shorter due to remaining substrate regions may be prevented.

The invention may be practiced in many ways, as various modifications to the embodiments described above will be apparent to those of skill in the art. What follows are exemplary, non-limiting descriptions of some embodiments of the invention.

According to some embodiments of the invention, there is provided a method of fabricating a recess transistor. A trench device isolation region is formed on an integrated circuit substrate to define an active region, and a gate trench is formed in the active region. Then, the trench device isolation region, which contacts to the sidewall of the gate trench and a substrate region remaining between the sidewall of the trench device isolation region and the sidewall of the gate trench, is etched to expose the remaining substrate region. Thereafter, the exposed portion of the remaining substrate region is removed to form a parallel and flat bottom of the gate trench, and then a recess gate that fills the gate trench is formed.

It is preferable that a portion of the substrate region, which remains between the sidewall of the trench device isolation region and the sidewall of the gate trench, is etched before exposing the remaining substrate region. It is also preferable that isotropic dry etching be performed when etching the portion of the remaining substrate region and forming the parallel and flat bottom of the gate trench. It is also preferable that wet etching be performed when exposing the remaining substrate region.

According to some other embodiments of the invention, there is provided a recess transistor in an integrated circuit device. The recess transistor includes a source/drain region, which is formed in an active region of an integrated circuit substrate, and a recess gate, which is formed in the integrated circuit substrate, which has a depth greater than the depth of the source/drain region, and which has a parallel and flat bottom.

According to still other embodiments of the invention, there is provided a recess transistor in an integrated circuit device. The recess transistor includes a source/drain region, which is formed in an active region that is defined by a shallow trench device isolation region in an integrated circuit substrate, and a recess gate, which is formed in the integrated circuit substrate while having a depth larger than the junction depth of the source/drain region. The channel length of the recess transistor at the edge of the active region, which is adjacent to the device separating region, and the channel length of the recess transistor at the center of the active region are the same.

While the invention has been particularly shown and described with reference to exemplary embodiments thereof, it will be understood by those of ordinary skill in the art that various changes in form and details may be made therein without departing from the spirit and scope of the invention as defined by the attached claims.

I claim:

1. A recess transistor fabricated by a method comprising:
    forming a trench device isolation region on an integrated circuit substrate to define an active region;
    forming a gate trench in the active region;
    etching the trench device isolation region, which contacts the sidewall of the gate trench, and a substrate region remaining between the sidewall of the trench device isolation region and the sidewall of the gate trench, to expose the remaining substrate region;
    removing the exposed portion of the remaining substrate region to form a substantially flat bottom of the gate trench; and
    forming a recess gate that fills the gate trench.

2. A recess transistor in an integrated circuit device, the recess transistor comprising:
    a source/drain region formed in an active region of an integrated circuit substrate; and
    a recess gate formed in the integrated circuit substrate, the recess gate having a depth greater than a junction depth of the source/drain region and having a substantially flat bottom,
    wherein a sidewall of the recess gate contacts a sidewall of a shallow trench device isolation region, which is formed in the integrated circuit substrate to define the active region, from the upper portion to the bottom.

3. A recess transistor comprising:
    a source/drain region formed in an active region that is defined by a shallow trench device isolation region in an integrated circuit substrate;
    a recess gate formed in the integrated circuit substrate that has a depth greater than a junction depth of the source/drain region; and
    a channel, a length of the channel at the edge of the active region substantially the same as a length of the channel at the center of the active region.

4. The recess transistor of claim 3, further comprising source/drain regions formed in the active region,
    wherein the source/drain regions are spaced apart from each other by an upper portion of the recess gate, and
    wherein a portion of the channel is below a bottom of the recess gate.

5. The recess transistor of claim 3, wherein a sidewall of the shallow trench device isolation region is exposed to the recess gate.

6. The recess transistor of claim 3, wherein the recess gate has a depth less than a depth of the shallow trench device isolation region.

7. The recess transistor of claim 3, wherein a bottom of the recess gate is substantially flat.

8. The recess transistor of claim 3, further comprising:
    a gate trench formed in the integrated circuit substrate,
    wherein the recess gate is formed in the gate trench, and
    wherein a portion of the recess gate in an upper region of the gate trench is narrower than a portion of the recess gate in a lower region of the gate trench.

* * * * *